(12) United States Patent
Kohli

(10) Patent No.: US 7,531,436 B2
(45) Date of Patent: May 12, 2009

(54) HIGHLY CONDUCTIVE SHALLOW JUNCTION FORMATION

(75) Inventor: Puneet Kohli, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/057,509

(22) Filed: Feb. 14, 2005

(65) Prior Publication Data
US 2006/0183302 A1 Aug. 17, 2006

(51) Int. Cl.
*H01L 21/425* (2006.01)
(52) U.S. Cl. .................. 438/528; 438/142; 438/510
(58) Field of Classification Search .............. 438/142, 438/510, 528
See application file for complete search history.

(56) References Cited

U.S. PATENT DOCUMENTS

| | | | |
|---|---|---|---|
| 6,074,937 A | | 6/2000 | Pramanick et al. |
| 6,555,439 B1 | | 4/2003 | Xiang et al. |
| 6,642,122 B1 | * | 11/2003 | Yu .............................. 438/372 |
| 2003/0113961 A1 | * | 6/2003 | Horiuchi et al. ............. 438/157 |
| 2003/0193066 A1 | * | 10/2003 | Ito et al. ...................... 257/335 |
| 2003/0227062 A1 | * | 12/2003 | Horiuchi et al. ............. 257/382 |
| 2004/0082151 A1 | | 4/2004 | Chakravarthi et al. |
| 2004/0115889 A1 | | 6/2004 | Jain et al. |
| 2004/0132244 A1 | | 7/2004 | Cho |
| 2004/0132260 A1 | | 7/2004 | Lenoble |
| 2004/0253790 A1 | | 12/2004 | Ootsuka |

* cited by examiner

*Primary Examiner*—Davienne Monbleau
*Assistant Examiner*—Matthew Reames
(74) *Attorney, Agent, or Firm*—Jacqueline J. Garner; W. James Brady, III; Frederick J. Telecky, Jr.

(57) ABSTRACT

The invention relates to a method of forming a shallow junction. The method (100) comprises forming source/drain extension regions with a non-amorphizing tail implant (105) which is annealed conventionally (spike/RTP) and amorphizing implant which is re-grown epitaxially (SPER) (110). The non-amorphizing tail implant is generally annealed (106) before a doped amorphous layer for SPE is formed (107). SPE provides a high active dopant concentration in a shallow layer. The non-amorphizing tail implant (105) expands the source/drain extension region beyond the range dictated by the SPE-formed layer and keeps the depletion region of the P-N junction away from where end-of-range defects form during the SPE process. Thus, the SPE-formed layer primarily determines the conductivity of the junction while the tail implant determines the location of the depletion region. End-of-range defects form, but are not in a position to cause significant reverse bias leakage.

16 Claims, 4 Drawing Sheets

HIGHLY CONDUCTIVE SHALLOW JUNCTION FORMATION

FIELD OF THE INVENTION

The present invention relates generally to semiconductor device manufacturing and more particularly to methods of manufacturing devices with ultra-shallow junctions.

BACKGROUND OF THE INVENTION

In the semiconductor industry, there is a continuing trend toward high device densities. To achieve these high device densities, small features on semiconductor wafers are required. These features include source regions, drain regions, and channel regions that relate to devices, such as field effect transistors (FETs).

In the process of scaling down complementary metal oxide semiconductor (CMOS) devices, which are a type of FET, a vertical dimension must be reduced at the same time as horizontal dimensions are reduced. In particular, in order to avoid short channel effects, source and drain regions, or at least source/drain extension regions adjacent the channel, must be made extremely shallow with a corresponding increase in dopant density to avoid excessive resistance. The formation of ultra-shallow junctions, that is, junctions having source/drain regions no more than about 35 nm thick and with a dopant concentration not less than $5 \times 10^{19}$ atoms/cm3, is considered one Of the significant challenges in manufacturing the next generation of CMOS devices. The usual approach to forming source/drain regions is ion implantation. In the conventional approach, following implantation, the substrate is typically annealed to repair the lattice damage and activate the dopants. Such conventional anneal processes result in a modest amount of diffusion.

A process that limits diffusion and results in higher than equilibrium dopant activation is solid phase epitaxial re-growth (SPER). SPER involves re-crystallizing an amorphous doped region at a relatively low temperature, wherein the resulting dopant profile is close to the implanted profile, with little dopant diffusion occurring during the re-crystallization process.

While SPER of amorphous doped regions is effective in forming shallow implants with high dopant concentrations, there are obstacles to its implementation. The main concern is that end-of-range defects form in the region where re-crystallization begins. These defects, which are thought to involve interstitial silicon atoms, increase reverse bias leakage (and thereby increase Off-State current). Thus, there remains an unsatisfied need for effective methods of forming ultra-shallow junctions.

SUMMARY OF THE INVENTION

The following presents a simplified summary in order to provide a basic understanding of some aspects of the invention. This summary is not an extensive overview of the invention. The primary purpose of this summary is to present some concepts of the invention in a simplified form as a prelude to the more detailed description that is presented later.

One aspect of the invention relates to a method of forming a shallow junction. The method comprises forming source/drain extension regions with both a non-amorphizing tail implant followed by spike annealing and amorphizing implant(s) (which result in a doped amorphous layer) followed by solid phase epitaxy re-growth (SPER). The non-amorphizing tail implant is generally annealed before the shallow doped amorphous layer. The amorphous layer is subsequently re-grown expitaxially (SPER), e resulting in a high active dopant concentration in the shallow epitaxially re-grown layer. The non-amorphizing tail implant expands the source/drain extension region beyond the original amorphous/crystalline interface and thus keeps the depletion region of the P-N junction away from where end-of-range defects form during the SPER process. The epitaxially re-grown doped layer primarily determines the conductivity of the junction while the tail implant determines the location of the depletion region. End-of-range defects form, but are not in a position to cause significant reverse bias leakage since they are located or positioned away from the depletion region.

Another aspect of the invention relates to a semiconductor device, comprising a gate having a channel, source and drain regions, and source and drain extension regions. The source and drain extension regions comprise a highly conductive epitaxially re-grown layer having dopant concentrations of at least about $2.0 \times 10^{20}$ atoms/cm$^3$. There are end-of-range defects at the end of the epitaxially re-grown layer, but the extension regions extend beyond the location of the end-of-range defects, and therefore the defects are displaced from the depletion regions formed between the source/drain extension regions and the channel.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
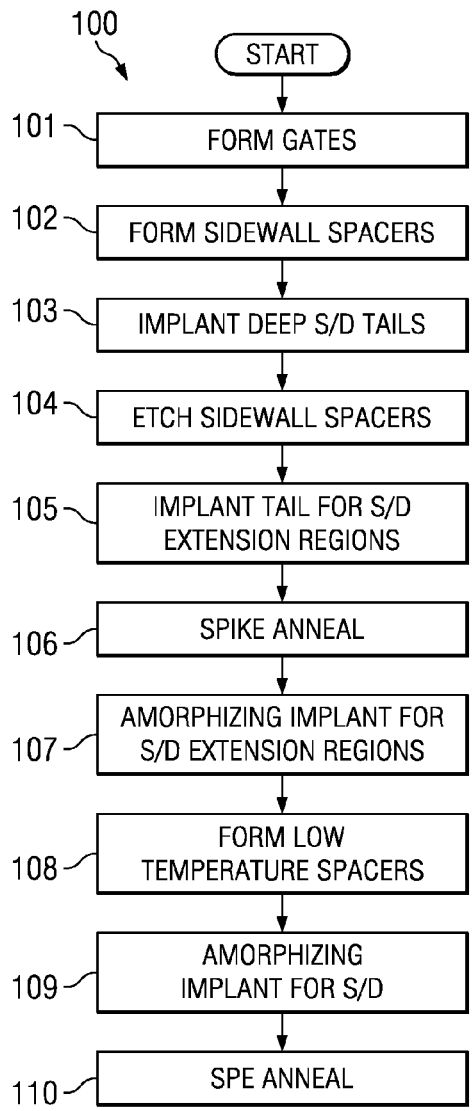
FIG. 1 is a flow chart of an exemplary process according to the invention.

The present invention will now be described with reference to the attached drawings, wherein like reference numerals are used to refer to like elements throughout. Exemplary processes comprising series of acts and events are provided. The present invention is not limited by the ordering of the acts and events in these examples as some acts may occur in different orders and/or concurrently with other acts or events. In addition, not all illustrated acts or events are required to implement a methodology in accordance with the present invention.

FIG. 1 illustrates an exemplary process 100 for forming a P-N junction within a semiconductor substrate according to one aspect of the present invention. The process 100 includes gate formation 101, forming sidewall spacers 102, forming deep source/drain implants 103, and etching away the sidewall spacer 104. The process further includes forming a source/drain extension region tail implant 105, annealing to activate the dopants 106, forming a doped amorphous layer 107, forming low temperature spacers 108, forming a thicker doped amorphous layer for the source/drain regions 109, and annealing at low temperature to induce solid phase epitaxial re-growth (SPER) within the doped amorphous layers 110.

The gates are formed over a semiconductor substrate. The semiconductor substrate includes a semiconductor crystal, typically silicon. Other examples of semiconductors include GaAs, SiGe and InP. In addition to a semiconductor crystal, the substrate may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc.

Act 101 is forming gates on the semiconductor substrate. Forming gates generally involves forming isolation regions, providing a threshold implant into the substrate for the gate channels, forming a gate oxide layer, forming a gate electrode layer, and lithographically patterning the gates from the resulting gate stack. Lithographically patterning the gates generally involves forming a resist coating, patterning the resist, using the patterned resist to pattern the gate stacks, and then removing the resist.

Act 102 is forming sidewall spacers. Sidewall spacers are generally formed from a silicon nitride or other dielectric materials. The silicon nitride is deposited and then etched to expose the source/drain regions except immediately adjacent the gates, whereby the sidewall spacers provide a mask for subsequently performed deep source/drain implants.

Act 103 is performing a deep source/drain tail implant. Act 104 is etching to remove the sidewall spacers and expose the semiconductor surface adjacent the gates where the source/drain extension regions will be formed. Act 105 comprises a non-amorphizing tail implant for the source/drain extension regions. This is a relatively light and shallow implant. Although the implant is shallow, it changes the conductivity type of the substrate to a depth greater than the depth of a subsequently provided amorphous layer created during act 107. The non-amorphizing implant provides contact between the channel regions and the source/drain extension regions but is not so deep or heavy as to cause short channel effects. Preferably, the implant alters the conductivity type of the substrate to a depth of about 500 Å or less, more preferably about 300 Å or less, most preferably about 200 Å or less.

Act 106 is a spike anneal to activate the dopants associated with the deep source/drain tail implant and the source/drain extension region tail implant. The temperature is raised briefly, but not so long as to cause excessive diffusion of the dopants. Spike anneals can be carried out with peak temperatures up to about 1100° C. Act 107 comprises forming a doped amorphous layer. Generally this comprises amorphizing a layer of the substrate by ion bombardment. The amorphizing ions can be the dopant ions, however, where the dopant ions are light, as in boron ions, neutral ions can be used for amorphization prior to implanting the dopant. An amorphous layer in the range from about 10 to about 100 nm thick (or deep) can be formed by bombarding the surface with from about $1 \times 10^{13}$ to about $1.5 \times 10^{15}$ atoms/cm$^2$ or more at an energy from about 2 to about 100 keV. For example, an amorphous layer from about 15 to about 20 nm thick (or deep) in silicon can be produced using about $1 \times 10^{14}$ to about $2 \times 10^{14}$ atoms/cm$^2$ Ge at an energy of about 15 keV, or alternatively with about $4 \times 10^{13}$ to about $5 \times 10^{13}$ atoms/cm$^2$ In or Sb at an energy of about 25 keV. Where doping and amorphization are two separate steps, amorphization takes place first in order to prevent dopant channeling during implantation.

Act 108 is forming low temperature spacers. The purpose of these spacers is to mask the source/drain extension regions while forming a deep doped amorphous layer for the source/drain regions during step 109. Low temperatures are used, because high temperatures are avoided during all steps following the formation of the doped amorphous layer for the source drain extension regions. This is done to ensure that the epitaxial re-growth of the extensions is simultaneous or concurrent with that of the deep source/drain regions. If the extension regions re-grow during the spacer formation, then the subsequent thermal treatment to activate/re-grow the deep source/drain regions may cause deactivation as well as diffusion of the dopants in the extensions regions.

Act 109 comprises forming a doped amorphous layer in the source/drain regions. This layer is deeper than the implant of act 107, however, it is shallower than the implant act of 103. Act 110 comprises heating the substrate to cause solid phase epitaxial re-growth (SPER) in the doped amorphous layers (in both the extension and deep source/drain regions). Mild heating, such as in the temperature range from about 550° C. to about 700° C. for about 10 minutes to about an hour, generally brings about crystal re-growth. For example, a silicon crystal can generally be re-grown by maintaining it at a temperature of about 600° C. for about half an hour. Crystals grow from the intact portion of the substrate beneath the amorphized layer. Preferably, the dopants within the amorphous layer substantially maintain their as-implanted concentration profiles during the SPER process. SPER incorporates the dopants into the re-grown crystal structure in substitutional sites. The resulting active dopant concentrations can exceed about $2.0 \times 10^{20}$ atoms/cm$^3$, and preferably exceed about $2.5 \times 10^{20}$ atoms/cm$^3$.

Figure 9:
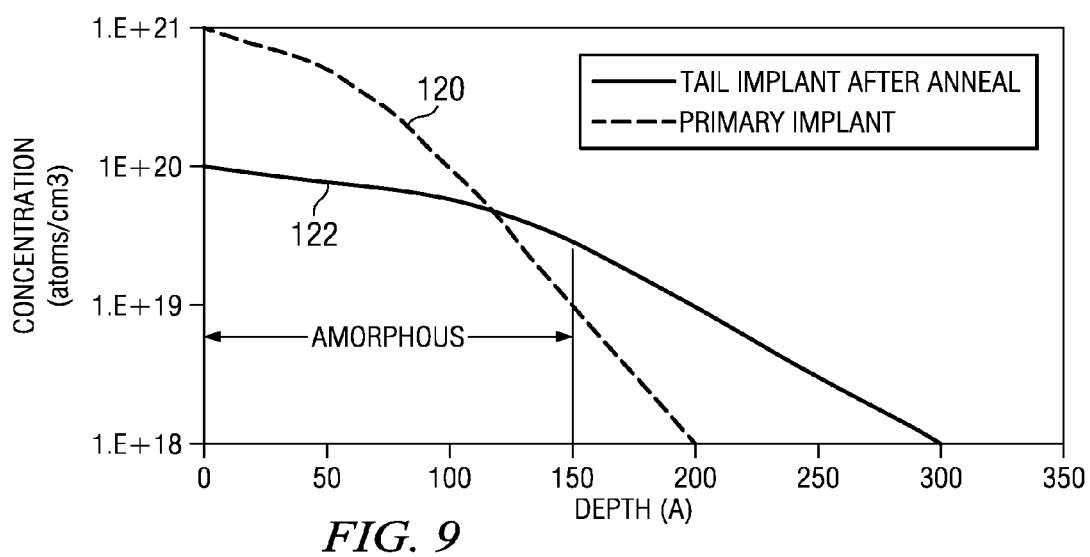
FIG. 9 is a plot showing exemplary tail and SPE implants for a shallow junction according to one aspect of the present invention.

FIG. 9 is a plot showing the typical dopant concentration profiles resulting from the acts 105 through 107 of the process 100. The Y-axis is the dopant concentration in atoms/cm$^3$ and the X-axis is depth in Angstroms. The tail implant provided by act 105 and indicated by the line 122 with diamond-shaped points is deeper than the region formed by act 107 and indicated by the line 120 with square points. The region identified as amorphous is re-crystallized by act 110. End-of-range defects remain at the boundary of the amorphous region after crystallization, however, due to the tail implant these defects advantageously are not at the boundary of the doped region, which is where the depletion region occurs.

Figure 2:
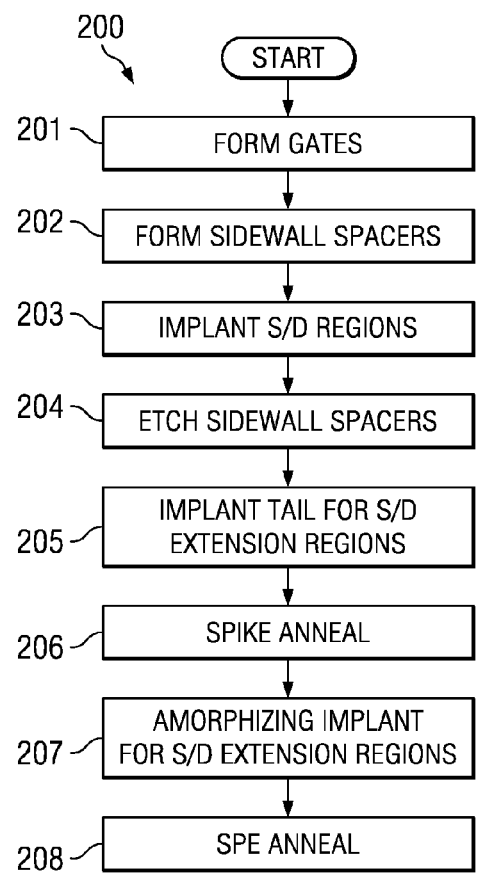
FIG. 2 is a flow chart of another exemplary process according to the invention.

FIG. 2 illustrates another exemplary process 200 for forming a P-N junction within a semiconductor substrate according to one aspect of the present invention. The process 200 includes gate formation 201, forming sidewall spacers 202, forming deep source/drain implants 203, and etching away the sidewall spacer 204. The process further includes forming a source/drain extension region tail implant 205, annealing to activate the dopants 206, forming a doped amorphous layer 207, and annealing at low temperature to induce solid phase epitaxial re-growth (SPER) within the doped amorphous layers 208.

Figure 3:
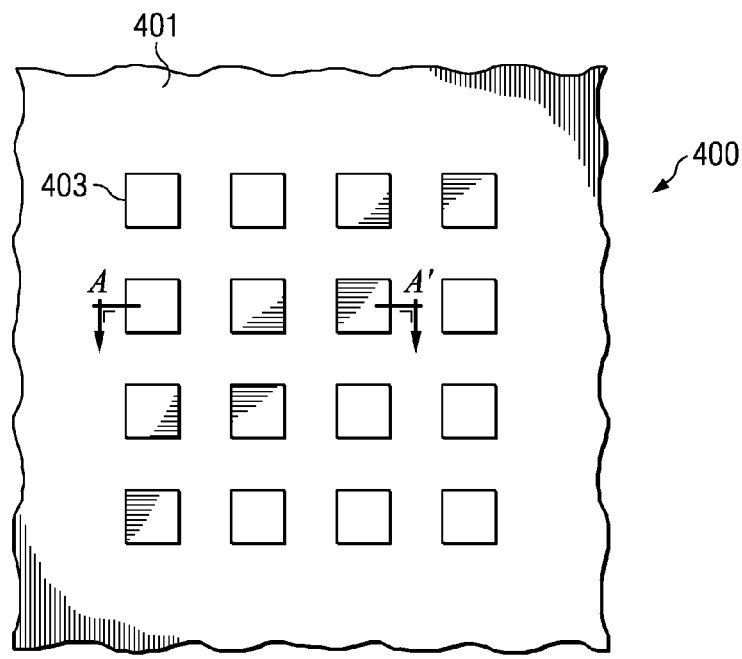
FIG. 3 is a plan view of a semiconductor substrate illustrating field oxide islands formed thereon.
Figure 4:
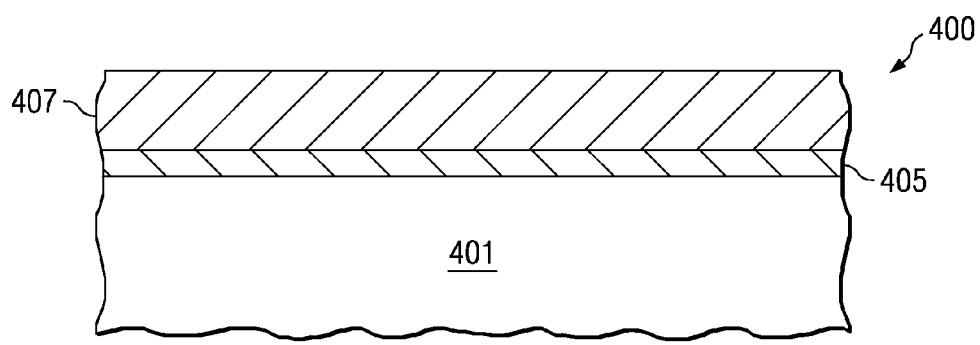
FIG. 4 is a cross section diagram illustrating of the semiconductor substrate of FIG. 3 taken along line A-A' after forming gate stacks.
Figure 5:
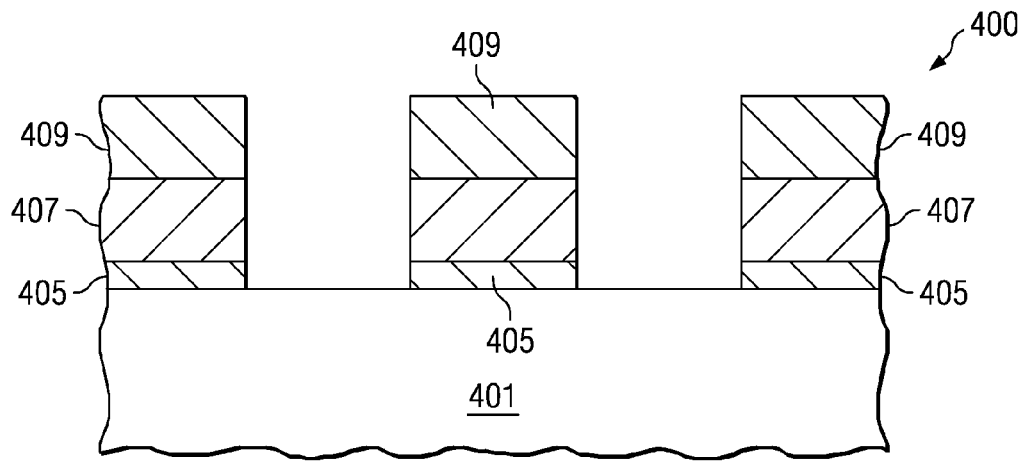
FIG. 5 is a cross section diagram illustrating the semiconductor substrate of FIG. 4 after patterning the gate stack.

Act 201 is forming gates on the semiconductor substrate, which is illustrated in one example with device 400 in FIGS. 3-5. The device 400 includes semiconductor substrate 401 and field oxide islands 403. The field oxide can comprise any suitable insulator, including for example silicon dioxide or tetraethyl orthosilicate (TEOS). The field oxide islands 403 can be formed by any suitable process, for example LOCOS (local oxidation of silicon) or STI (shallow trench isolation), and can be formed in any type of pattern. In fact, in many instances the isolation is formed in rings or other patterns to surround various different active regions.

Act 201 further includes providing a threshold implant to the semiconductor of the substrate. This implant provides a first conductivity type within a layer of the semiconductor adjacent a surface of the substrate.

Act 201 also comprises providing a gate layer. Generally, gate layers are formed with silicon dioxide and are referred to as gate oxide layers. However, for very small devices, it is often desirable to use a material that has a lower electrical resistance than silicon dioxide and can be provided in greater thickness than an equivalent silicon dioxide layer. Such materials are referred to as high-K dielectrics and include, for example, silicates, aluminates, titanates, and metal oxides. Examples of silicate high-K dielectrics include silicates of Ta, Al, Ti, Zr, Y, La and Hf, including Zr and Hf doped silicon oxides and silicon oxynitrides. Examples of aluminates high-K dielectrics include transition metal aluminates, such as compounds of Zr and Hf. Examples of titanate high-K dielectrics include $BaTiO_3$, $SrTiO_3$, and $PdZrTiO_3$. Examples of metal oxide high-K dielectrics include oxides of refractory metals, such as Zr and Hf, and oxides of Lanthanide series metals, such as La, Lu, Eu, Pr, Nd, Gd, and Dy. Additional examples of metal oxide high-K dielectrics include $Al_2O_3$, $TiO_2$, $Ta_2O_5$, $Nb_2O_5$ and $Y_2O_3$.

The gate layer is formed by any suitable process including, for example, oxidation, spin coating, or CVD. In one embodiment, the layer is from about 1 nm to about 100 nm thick. In another embodiment, the layer is from about 3 nm to about 50 nm thick. In a further embodiment, the layer is from about 5 nm to about 30 nm thick.

Act 201 still further includes forming a gate electrode layer over the gate oxide layer. The gate electrode layer is typically a poly layer. FIG. 4 illustrates a cross-section of the substrate 400, taken along the line A-A' of FIG. 3 after formation of a gate layer 405 and a poly layer 407. A poly layer is one containing either amorphous silicon or polysilicon. In one embodiment, the poly layer has a thickness of about 40 nm to about 120 nm. In another embodiment, the poly layer has a thickness of about 50 nm to about 1000 nm. In a further embodiment, the poly layer has a thickness of about 60 nm to about 90 nm.

Act 201 also includes patterning the poly layer. The first step in patterning is generally forming a resist coating over the poly layer. Any suitable resist may be used. The resist is lithographically patterned and the pattern is transferred by etching the exposed portion of the underlying poly and gate layers. FIG. 5 illustrates the substrate 400 after patterning with resist coating 409. After patterning the gate stacks, the resist is stripped The pattern includes gaps that have any suitable size or shape. In one embodiment, the pattern includes gaps having widths within the range from about from 0.01 to about 10 μm. In another embodiment, the pattern includes gaps having widths within the range from about from 0.01 to about 1.0 μm. In a further embodiment, the pattern includes gaps having widths within the range from about from 0.01 to about 0.045 μm.

Act 202 is forming the sidewall spacers 419. This comprises depositing a spacer material and anisotropically etching the material. The spacer material remains only adjacent the gate stacks, as illustrated for the device 400 in FIG. 6.

Figure 6:
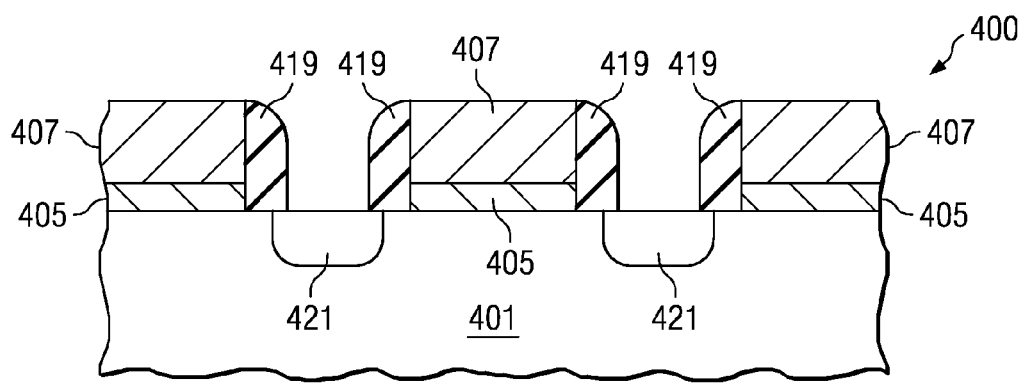
FIG. 6 is a cross section diagram illustrating the semiconductor substrate of FIG. 5 after forming spacers and deep source/drain implants.

Act 203 comprises a source/drain implant. FIG. 6 illustrates the device 400 provided with source/drain regions 421. The spacer material 419 creates a separation between the source/drain regions 421 and the gate stacks.

Figure 7:
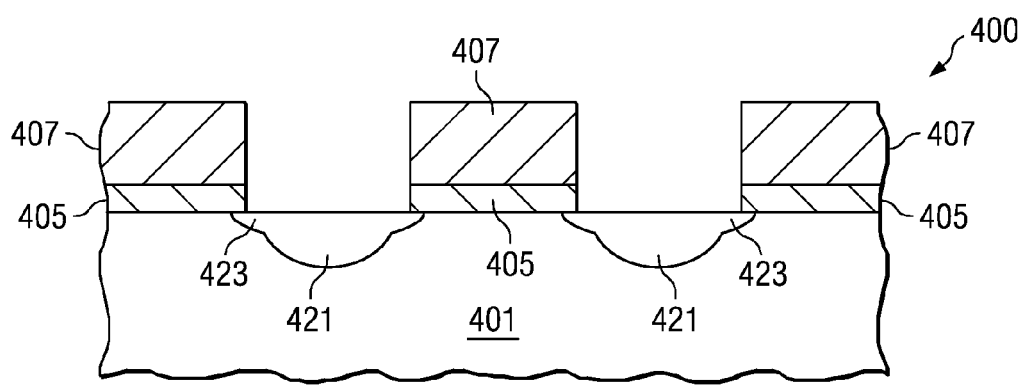
FIG. 7 is a cross section diagram illustrating the semiconductor substrate of FIG. 6 after removing the spacers and forming tail implants for source/drain extension regions.

Act 204 is etching to remove the sidewall spacers. After the sidewall spacers are removed, the source/drain tail implants are formed by act 205. Act 206 is a spike anneal to activate the implants. The resulting structure is illustrated in FIG. 7. The source/drain regions 421 have expanded to include extension regions 423.

Figure 8:
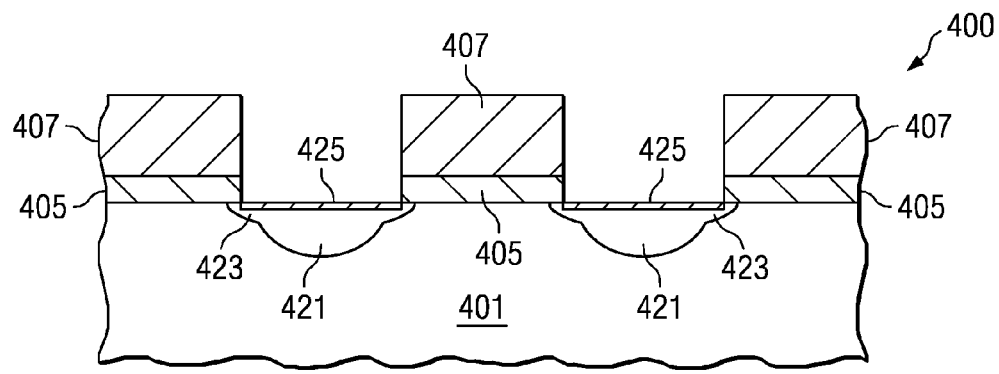
FIG. 8 is a cross section diagram illustrating the semiconductor substrate of FIG. 7 after SPER.

Act 207 is an amorphizing implant for the source/drain extension regions. This provides a doped amorphous layer across the entirety of the source/drain regions including the source/drain extension regions. In this example, a deeper doped amorphous layer for the deep source/drain regions is not provided. Act 208 is an SPER anneal to re-crystallize the amorphous layer and form the shallow highly conductive region 425 illustrated in FIG. 8. If contacts are placed in the source and drain regions, the resistances between the contacts include a resistance across the channel, a resistance through source/drain extension regions beyond the shallow highly conductive region 425, a resistance through the shallow highly conductive region 425, and a resistance through the deeper part of the source drain regions 421. The source/drain extension regions beyond the shallow highly conductive region have a small conductive cross-section and a relatively low conductivity, but are very short and therefore do not substantially increase the overall resistance. The shallow highly conductive regions 425 are the dominant conductive element of the source/drain extension regions and greatly reduce the resistivity of these regions relative to the tail implant alone. The deep source/drain implants provide a much larger cross sectional area for conduction and can maintain low resistance over comparatively long distances.

The invention is particularly useful for semiconductor devices that are not stable at high temperatures. Examples of such devices include devices using SiGe semiconductor crystals and devices that use high-K dielectics. Highly conductive shallow junctions and source/drain regions can be formed with a minimum of high-temperature processing.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of forming a P-N junction within a semiconductor substrate, comprising:

providing a crystalline semiconductor substrate having a first doping type;

forming a gate stack over the substrate and patterning the stack to form gates;

forming spacers adjacent the gate stacks;

implanting a dopant of a second type to form deep source/drain implants;

etching the spacers;

performing a non-amorphous implanting dopant of the second type to form source/drain extension region tail implants having a depth within the substrate;

after performing the non-amorphous implanting of dopant, forming an amorphous semiconductor layer having the second doping type within and overlying the source/drain extension region tail implants; and then, performing a low temperature anneal to cause epitaxial growth within the amorphous layer, wherein the region of amorphization and epitaxial growth does not extend to the depth of the source/drain extension region tail implant.

2. The method of claim 1, further comprising annealing the source/drain extension region tail implants prior to forming the amorphous semiconductor layer.

3. The method of claim 1, wherein forming the amorphous semiconductor layer comprises an amorphizing ion implant.

4. A method of forming a P-N junction within a semiconductor substrate, comprising:

providing a crystalline semiconductor substrate having a first doping type;

forming a gate stack over the substrate and patterning the stack to form gates;

forming spacers adjacent the gate stacks;

implanting a dopant of a second type to form deep source/drain implants;

etching the spacers;

implanting dopant of the second type to form source/drain extension region tail implants having a depth within the substrate;

forming an amorphous semiconductor layer having the second doping type within and overlying the source/drain extension region tail implants;

performing a low temperature anneal to cause epitaxial growth within the amorphous layer, wherein the region of amorphization and epitaxial growth does not extend to the depth of the source/drain extension region tail implant forming a second set of spacers adjacent the gate stacks after forming the amorphous semiconductor layer; and forming a second, deeper, amorphous layer over the source/drain regions prior to performing the low temperature anneal.

5. The method of claim 1, wherein the gate stack comprises a high-K dielectric.

6. The method of claim 1, wherein the semiconductor comprises SiGe.

7. The method of claim 1, wherein the region of amorphization and epitaxial growth has dopant concentrations of at least about $2.0 \times 10^{20}$ atoms/cm$^3$.

8. The method of claim 7, wherein the tail implant provides dopant concentrations not exceeding about $2 \times 10^{19}$ atoms/cm$^3$ outside the region of epitaxial growth.

9. The method of claim 7, wherein the region of amorphization and epitaxial growth has dopant concentrations of at least about $2.5 \times 10^{20}$ atoms/cm$^3$.

10. The method of claim 1, wherein the epitaxial growth leaves end-of-range defects and the end-of-range defects lie outside depletion regions created by the P-N junction.

11. The method of claim 1, wherein the source/drain extension region tail implant defines the junction location, but the region of epitaxial growth primarily determines the conductivity of the source/drain extension regions.

12. The method of claim 1, wherein forming the amorphous semiconductor layer having the second doping type comprises implanting ions at a density of at least about $1.5 \times 10^{15}$ atoms/cm$^2$.

13. The method of claim 1, wherein the amorphous layer in no more than about 200 Å deep.

14. The method of claim 1, wherein the resulting junction is no more than about 350 Å deep.

15. The method of claim 1, further comprising salicidation of the source/drain regions.

16. The method of claim 1, wherein some of the gates have widths of about 45 nm or less.

* * * * *